United States Patent
Watanabe et al.

(10) Patent No.: US 8,790,948 B2
(45) Date of Patent: Jul. 29, 2014

(54) METHOD FOR MANUFACTURING A SOLAR CELL

(75) Inventors: Keiji Watanabe, Kokubunji (JP); Toshiyuki Mine, Fussa (JP); Akio Shima, Hino (JP); Tomoko Sekiguchi, Hino (JP); Ryuta Tsuchiya, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/303,227

(22) Filed: Nov. 23, 2011

(65) Prior Publication Data

US 2012/0149143 A1 Jun. 14, 2012

(30) Foreign Application Priority Data

Dec. 10, 2010 (JP) ................................. 2010-275244

(51) Int. Cl.
*H01L 21/00* (2006.01)

(52) U.S. Cl.
USPC ................. 438/57; 438/962; 257/E27.124

(58) Field of Classification Search
USPC ................................... 438/57, 962
See application file for complete search history.

(56) References Cited

U.S. PATENT DOCUMENTS

| 5,797,998 A | 8/1998 | Wenham et al. |
| 8,187,907 B1 * | 5/2012 | Newman ........................ 438/66 |
| 2009/0165839 A1 | 7/2009 | Zeman et al. |
| 2009/0189253 A1 * | 7/2009 | Nakahata et al. ............. 257/615 |
| 2010/0062560 A1 * | 3/2010 | Farris et al. ..................... 438/68 |
| 2010/0258164 A1 | 10/2010 | Takeda et al. |
| 2011/0084307 A1 * | 4/2011 | Miki et al. ..................... 257/103 |
| 2011/0126895 A1 * | 6/2011 | Uda et al. ....................... 136/255 |

FOREIGN PATENT DOCUMENTS

| JP | 3-284882 A | 12/1991 |
| JP | 9-511102 A | 11/1997 |
| JP | 2000-243948 A | 9/2000 |
| JP | 2009-59915 A | 3/2009 |
| JP | 2009-517876 A | 4/2009 |

OTHER PUBLICATIONS

Japanese Office Action (English translation only) dated Aug. 20, 2013 (Six (6) pages).

* cited by examiner

*Primary Examiner* — Calvin Choi
(74) *Attorney, Agent, or Firm* — Crowell & Moring LLP

(57) ABSTRACT

In the existent method for manufacturing a solar cell, manufacture of a solar cell having a quantum well having a crystalline well layer and capable of controlling the thickness of the well layer was difficult. A quantum well having an amorphous well layer, comprising a barrier layer and an amorphous well layer is formed and then the quantum well having the amorphous well layer is annealed thereby crystallizing the amorphous well layer to form a quantum well having a crystalline well layer. By applying energy density applied to the amorphous well layer at an energy density of 1.26 J/mm$^2$ or more and 28.8 J/mm$^2$ or less, the crystalline well layer can be formed and the lamination structure of the quantum well can be maintained simultaneously.

9 Claims, 11 Drawing Sheets

METHOD FOR MANUFACTURING A SOLAR CELL

CLAIM OF PRIORITY

The present application claims priority from Japanese patent application JP 2010-275244 filed on Dec. 10, 2010, the content of which is hereby incorporated by reference into this application.

FIELD OF THE INVENTION

The present invention concerns a method for manufacturing a solar cell.

BACKGROUND OF THE INVENTION

In recent years, it has been attempted vigorously to use a quantum confinement structure such as a quantum well or a quantum dot as a material for solar cells. This is motivated by that the band gap of the quantum confinement structure can be controlled by the size of confinement. The solar cell can most effectively utilize a light having an energy near the band gap of a light absorption layer. Therefore, if the band gap can be set to an energy near the peak of an intensity in solar spectra, a high efficiency solar cell can be attained.

Further, when quantum confinement effect is used, different band gaps can be attained depending on the confinement size even for an identical material. Therefore, it is expected, for example that a tandem solar cell comprising a plurality of sub cells having different band gaps can be manufactured simply by using the quantum confinement structure.

SUMMARY OF THE INVENTION

In the present invention, a solar cell utilizing the quantum well is noted among quantum confinement structures. For the conditions required for the quantum well used as the material for the solar cell, two features that the crystallinity of the well layer is high and that the thickness of the well layer can be controlled are particularly important. In constituent layers of the quantum well, a layer where carriers are present at high probability is referred to as a well layer and another layer acting as an energy barrier for the carriers is referred to as a barrier layer respectively hereinafter.

The reason why the crystallinity of the well layer is important is as described below. Generally, an amorphous material has a band gap wider than that of a crystalline material of an identical composition. Therefore, if the crystallization in the well layer of the solar cell is insufficient and amorphous ingredients are present in the well layer, the amorphous ingredients have narrower wavelength region for a light that can be absorbed than that of crystalline ingredients and decrease the light absorption efficiency of the solar cell. Further, another reason for the importance of the crystallinity of the well layer is that since the carrier mobility in the amorphous material is generally low, it is desirable that the well layer as the carrier transfer channel comprises a crystalline material for decreasing the series resistance and increasing the output current of the solar cell.

Further, the reason why the controllability for the thickness of the well layer is important is as described below. The band gap of the quantum structure is decided depending on the size of confinement as described above. Accordingly, a quantum well having a well layer of different thickness has a different band gap. When a plurality of well layers in a solar cell have band gaps different from each other, energy barrier for the carrier transfer between the well layers is generated to decrease the output current of the solar cell. Further, it has been generally known that a mini band is formed inside the band gap when the barrier layer is thin and there is a large overlap of wavefunctions between adjacent well layers. It is expected that the output current can be increased by utilizing this property to the solar cell and using the mini band as the carrier transfer path. In this case, it is necessary for forming the mini band that the thickness of the well layer and the barrier layer is uniform over the entire quantum well region. Accordingly, controllability for the thickness of the well layer is important also for forming the mini band.

As described above, in the solar cell having the quantum well, the crystallinity of the well layer in the quantum well and the controllability for the thickness of the well layer are important. As a method for manufacturing a solar cell having a quantum well, Japanese Unexamined Patent Application Publication (Translation of PCT Application) No. H09 (1997)-511102 discloses a method of alternately depositing well layers and barrier layers by a CVD method. On the other hand, for forming a crystalline well layer, while it may be considered a method of using epitaxy among the film deposition methods, this is a complicate process and is not practical.

Then, prior to the filing of the present application, the present inventors have investigated a method of forming a quantum well having an amorphous well layer by a simple film deposition method such as a CVD method and then crystallizing the well layer by applying thermal annealing. However, this method involves a problem that constituent elements of the quantum well diffuse thermally during thermal annealing and, as a result, the laminate structure before thermal annealing is not maintained and the thickness of the well layer cannot be controlled.

FIGS. 1A and 1B show cross sectional transmission electron microscopic photographs before and after thermal annealing of a quantum well using Si as a well layer and $SiO_2$ as a barrier layer. FIG. 1A shows a photograph for a quantum well just after film deposition by a CVD method and before annealing. It can be confirmed that a structure where a $SiO_2$ layer 1 and an amorphous Si layer 2 are laminated alternately. FIG. 1B shows a result of applying thermal annealing at 1100° C. for 8 minutes to the quantum well shown in FIG. 1A in a nitrogen atmosphere. In the specimen shown in FIG. 1B, while Si is crystallized, the lamination structure is broken as a result of thermal diffusion of the constituent element as described above to form a state where quantum dots of crystalline Si 3 are present inside the $SiO_2$ layer 1.

As described above, a method capable of both crystallizing the quantum layer of the quantum well and maintaining the lamination structure of the quantum well has not yet been known so far as a method for manufacturing a solar cell having a quantum well. The present invention has been achieved in view of such a situation and intends to provide a solar cell having a crystalline well layer and capable of controlling the thickness of the well layer. The foregoing and other objects as well as novel features of the invention will become apparent with reference to the descriptions of the present specification and the appended drawings.

Among the inventions discloses in the present application, typical inventions are to be described briefly as below. That is, the invention provides, in a first aspect, a method for manufacturing a solar cell including:
a first step of forming a first barrier layer,
a second step of forming a second barrier layer, a third step of forming a first well layer disposed between the first barrier layer and the second barrier layer, and containing Si, and a fourth step of applying an energy density at 1.26 J/mm² or more and 28.8 J/mm² or less to the first well layer.

The invention provides, in a second aspect, a method for manufacturing a solar cell having a quantum well including: a first barrier layer, a second barrier layer, and a first well layer, the method including:

a first step of forming the first barrier layer, a second step of forming the second barrier layer, a third step of forming the first well layer disposed between the first barrier layer and the second barrier layer and containing Si, and a fourth step of applying an energy density at 1.26 J/mm² or more and 28.8 J/mm² or less to the quantum well.

According to the aspects of the present invention, a solar cell comprising a quantum well having a crystalline quantum well and capable of controlling the thickness of the well layer can be manufactured.

DETAILED DESCRIPTION OF THE PREFERRED EMBODIMENTS

First Embodiment

Figure 2A:
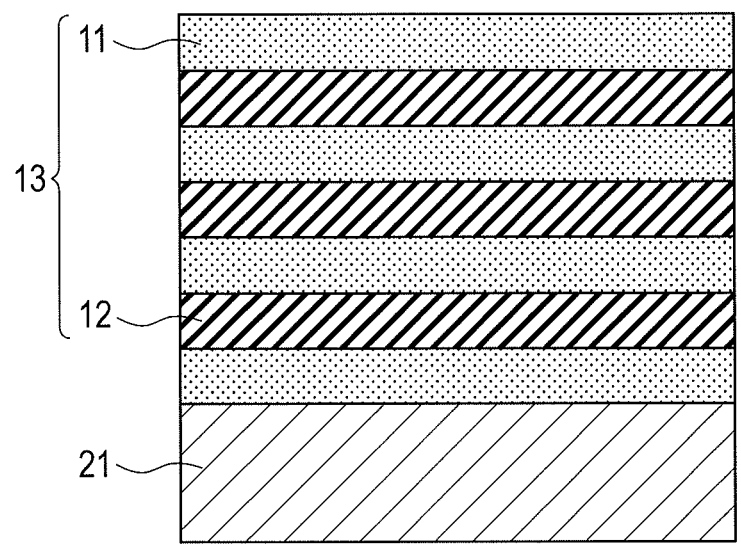
FIG. 2A shows an example of a first cross sectional view showing a method for manufacturing a solar cell according to a first embodiment of the present invention.
Figure 2B:
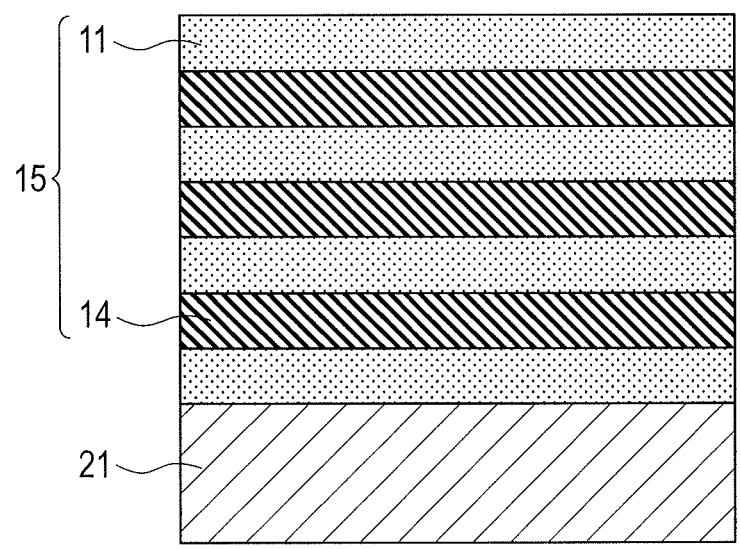
FIG. 2B shows an example of a second cross sectional view showing a method for manufacturing a solar cell according to the first embodiment of the present invention.
Figure 2C:
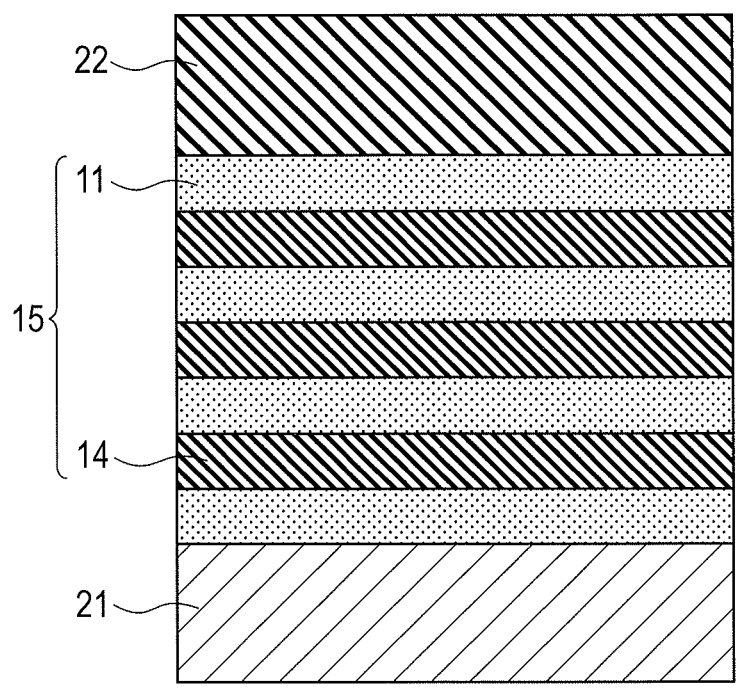
FIG. 2C shows an example of a third cross sectional view showing a method for manufacturing a solar cell according to the first embodiment of the present invention.

FIG. 2A to FIG. 2C show the outline of manufacturing steps for a solar cell according to a first embodiment of the present invention. Generally, a solar cell comprises pn junction or pin junction between identical or different semiconductors, or Schottky junction between a metal and a semiconductor. While the first embodiment shows an example of a solar cell comprising the pin junction containing an i-layer of a quantum well, the method of the first embodiment is applicable also to solar cells of any type and is applicable also to any semiconductor layer forming the junction of a solar cell.

In the first embodiment, a p-layer 21 of pin junction is formed at first. The p-layer 21 may be a substrate per se, or may be formed by an impurity diffusion method such as an ion implantation, a gas phase diffusion method, or a solid phase diffusion method to a substrate. Alternatively, the p-layer 21 may also be formed on the substrate by a film deposition method such as a CVD method, a sputtering method, or a vapor film deposition method. Then, a quantum well 13 having amorphous well layers each comprising a barrier layer 11 and an amorphous well layer 12 is formed (FIG. 2A). The amorphous well layer 12 is formed by a film deposition method such as a CVD method, a sputtering method, or a vapor film deposition method. If necessary, the amorphous well layer 12 may be formed also of a semiconductor with addition of impurity. The material of the quantum layer 12 comprises Si. The barrier layer 11 may be formed by the film deposition method identical with that for the amorphous well layer 12. Further, when the constituent material for the barrier layer 11 is a compound such as an oxide or a nitride of the constituent material of the amorphous well layer 12, the barrier layer may also be formed by oxidation, nitridation, etc. of the amorphous well layer 12. The material of the barrier layer 11 is selected from the materials for example, $SiO_2$, SiN (silicon nitride), SiC (silicon carbide), etc. that form a barrier layer to Si which is the material for the well layer 12.

After forming the quantum well 13 having the amorphous well layer, the amorphous well layer 12 is crystallized by annealing to form a quantum well 15 having a crystalline well layer 14 (FIG. 2B). The annealing has a feature in that the energy density applied to the amorphous well layer 12 is at 1.26 $J/mm^2$ or more and 28.8 $J/mm^2$ or less on the ground to be described later and performed by an annealing method capable of performing treatment at high temperature in short time which is typically represented, for example, by laser annealing. In the annealing, energy may be applied also to the barrier layer 11. The effect obtained by applying the energy to the barrier layer 11 includes that the value for the band gap of the quantum well can be prevented from decreasing by the leak current in the barrier layer as a result of improvement in the film quality of the barrier layer 11.

After the crystallization of the amorphous well layer 12, pin junction is formed by forming an n-layer 22 (FIG. 2C). The n-layer 22 is formed by a film deposition method such as a CVD method, a sputtering method, or a vapor film deposition method. The order of forming the p-layer 21 and the n-layer 22 may be opposite to that in this first embodiment.

Figure 3:
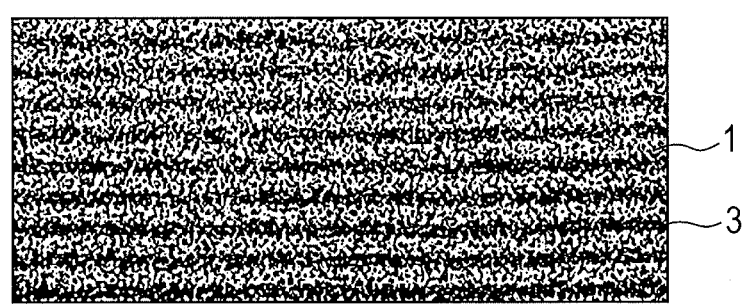
FIG. 3 shows a cross sectional transmission electron microscopic photograph of a specimen as a result of applying thermal annealing to a quantum well formed by a film deposition method.

In the first embodiment, for obtaining the effect of the invention, laser annealing may be performed, for example, by irradiating a carbonic gas CW laser light at a wavelength of 10.64 μm to a quantum well 13 having an amorphous well layer in which amorphous well layer 12 comprises amorphous Si of 2 nm thickness and a barrier layer 11 comprising $SiO_2$ of 2 nm thickness, under the conditions at a power density of 0.42 $kW/mm^2$, for an irradiation time of 3 ms or more and 5 ms or less. FIG. 3 shows a cross sectional transmission electron microscopic photograph for a specimen as a result of applying the laser annealing under the conditions described above.

Figure 1A:
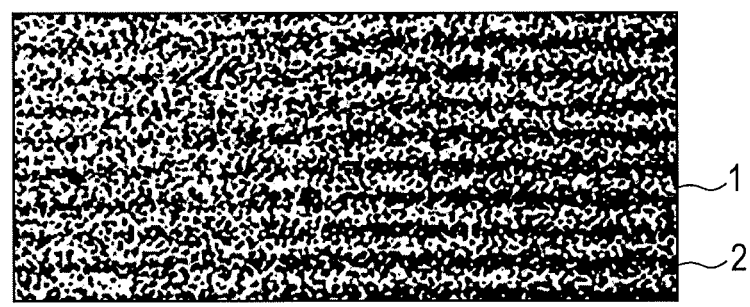
FIG. 1A shows an example of a cross sectional transmission electron microscopic photograph of a quantum well before annealing formed by a film deposition method.
Figure 1B:
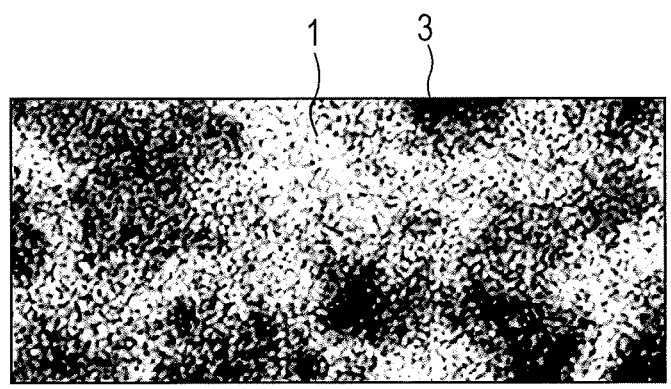
FIG. 1B shows a cross sectional transmission electron microscopic photograph of a specimen as a result of applying thermal annealing to the quantum well formed by the film deposition method.

When this is compared with a photograph before annealing shown in FIG. 1A, and a photograph after thermal annealing shown in FIG. 1B, it can be confirmed that the specimen after the laser annealing has a structure in which $SiO_2$ layers 1 and crystalline Si layers 3 are laminated alternately and it can be seen that the lamination structure of the $SiO_2$ layers 1 and the amorphous Si layers 2 before annealing is maintained.

Figure 4:
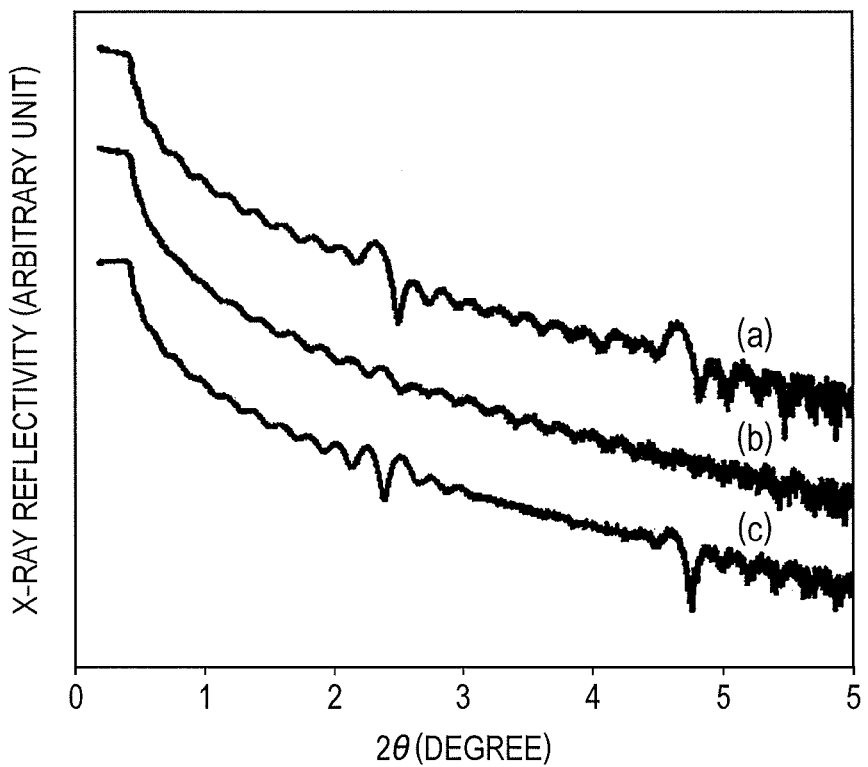
FIG. 4 shows examples of X-ray reflectivity spectra of a specimen before annealing, after thermal annealing, and after laser annealing of a quantum well formed by a film deposition method.

With respect to maintain the lamination structure of the quantum well, it was evaluated by X-ray reflectivity spectra in addition to the cross sectional transmission electron microscopic photograph described above. The result is shown in FIG. 4. FIG. 4 shows X-ray reflectivity spectra before annealing at (a), after thermal annealing at (b) and after leaser annealing at (c).

As can be seen from (a) in FIG. 4, the X-ray reflectivity spectra of the quantum well comprise two types of periodical interference peaks. The interference peak for the period of shorter distance corresponds to the thickness of the entire quantum well and the interference peak for the period of longer distance corresponds to the thickness for one layer of the well layer or the barrier layer.

According to (b) in FIG. 4, while the interference peak of the period of longer distance is not observed in the X-ray reflectivity spectra of the quantum cell, the interference peak of the period of shorter distance is observed. The results show that the lamination structure of the quantum well is broken by the thermal annealing and that the entire thickness is kept substantially constant also after the breakage of the lamination structure, respectively.

Finally, according to (c) in FIG. 4, both of the interference peak for the period of longer distance and the period of shorter distance are observed in the X-ray reflectivity spectra of the quantum well after leaser annealing. This supports the conclusion described above that the lamination structure of the quantum well is maintained also after laser annealing. As described above, it has been shown that the lamination structure is maintained in the quantum well also after the laser annealing in view of FIG. 1, FIG. 3, and FIG. 4.

Figure 5:
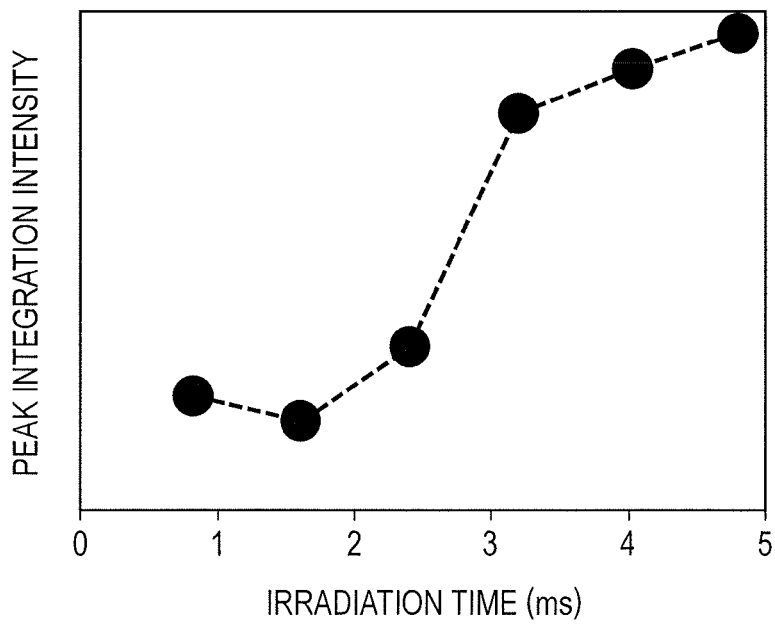
FIG. 5 shows an example of laser irradiation time dependence of an integration intensity for diffraction peaks of Si (111) crystals in an X-ray diffraction spectra of a specimen as a result of performing laser annealing to a quantum well formed by a film deposition method.

Then, crystallization of the well layer by laser annealing is to be described. In FIG. 5, X-ray diffraction spectrum of the quantum well specimen in which the well layer comprises Si and the barrier layer comprises $SiO_2$ after laser annealing is measured, and the integration intensity of the diffraction peaks of Si (111) crystals are plotted as a function of the laser irradiation time. It can be seen from FIG. 5 that the peak integration intensity differs greatly between a case where the irradiation time is 3 ms or less and where it is 3 ms or more. The result shows that Si layer is not crystallized by the laser annealing at an irradiation time of 3 ms or less and the irradiation time of 3 ms or more is necessary for the crystallization of the Si layer by the laser annealing under the conditions described above. It has been confirmed that the lamination structure of the quantum well after the laser annealing is maintained for all irradiation times shown in FIG. 5. The laser irradiation time is defined as 5 ms or less in order to avoid Si melting.

Then, it is to be described for the ground that the range of the energy density in the annealing is at 1.26 $J/mm^2$ or more and 28.8 $J/mm^2$ or less. The value of 1.26 $J/mm^2$ as the lower limit is determined on the basis of the result of experiment of the X-ray diffraction spectra described above, that is, on the result of an experiment that the irradiation time of 3 ms or more is necessary for crystalline of the Si layer as a result of annealing by a laser at a power density of 0.42 $kW/mm^2$.

On the other hand, the numerical value 28.8 $J/mm^2$ as the upper limit has been determined on the basis of the result of an experiment that the lamination structure of the quantum well is broken as shown in FIG. 1B when thermal annealing is applied at 1100° C. for 8 minutes to the quantum well as described above. The energy density applied to a specimen by the thermal annealing was estimated by the theory of the black body radiation as described below. That is, the power density of the black body radiation at a temperature T is represented by: Planck's distribution $I(\lambda, T)$ $(2hc^2/\lambda^5)/(\exp(hc/\lambda kT)-1)$. $\lambda$ is a wavelength, h is a Planck's constant, c is a velocity of light in vacuum, and k is a Boltzmann's constant. The power density of the thermal annealing at 1100° C. is obtained by integrating $I(\lambda, 1100° C.)$ for all the values of $\lambda$, which is equal to 0.06 $W/mm^2$. Thus, the energy density applied by the thermal annealing at 1100° C. for 8 minutes is 28.8 $J/mm^2$. This gives a ground for calculation that the range of the energy density in the annealing is 1.26 $J/mm^2$ or more and 28.8 $J/mm^2$ or less.

The first embodiment can crystallize the well layer and maintain the lamination structure of the quantum well simultaneously in the solar cell having the quantum well as a light absorption layer and, accordingly, can control the thickness of the well layer. The effect obtained as the result includes increase in the light absorption efficiency and increase in the carrier mobility due to crystallization of amorphous ingredients in the light absorption layer, and prevention for the occurrence of the energy band and increase in the mini band formation probability due to decrease in the variation of the band gap in the light absorption layer.

FIG. 6 is a view showing another example of the first embodiment. In the embodiment described above, the p-layer 21 and the n-layer 22 are formed in the vertical direction as shown in FIG. 2 relative to the quantum well 15 having the crystalline well layer. On the contrary, in this example, a p-layer side through electrode 31 and an n-layer side through electrode 32 are formed in the lateral direction of FIG. 6 relative to the quantum well 15 having the crystalline well layer as shown in FIG. 6. The structure of this example has an advantage that carriers generated as a result of light absorption in the crystalline well layer 14 can reach the p-layer side through electrode 31 or the n-layer side through electrode 32 without passing the barrier layer 11.

Figure 6A:
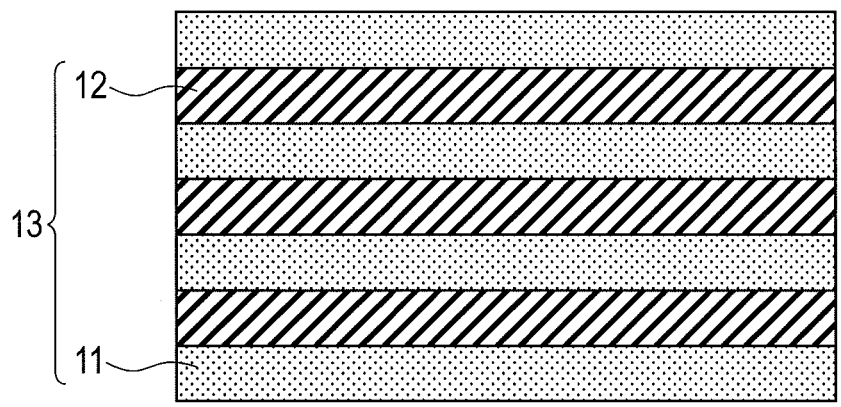
FIG. 6A shows an example of a first cross sectional view showing a method for manufacturing a solar cell according to another example of a first embodiment of the present invention.
Figure 6B:
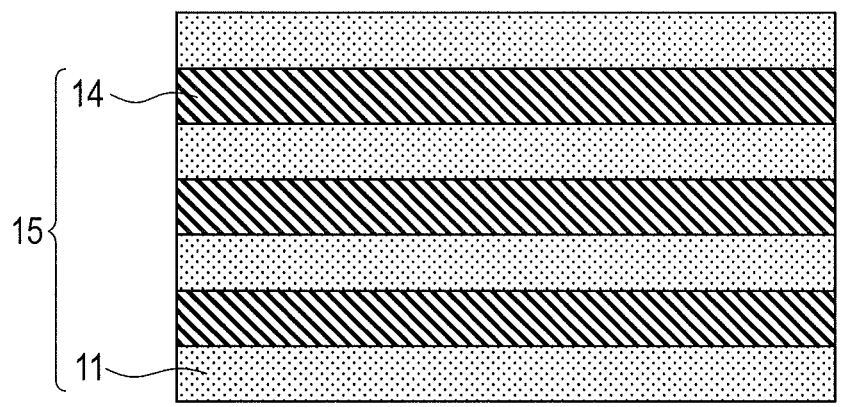
FIG. 6B shows an example of a second cross sectional view showing a method for manufacturing a solar cell according to another example of a first embodiment of the present invention.

In this embodiment, as shown in FIG. 6A, a quantum well 13 having an amorphous well layer is at first formed by the same method as in the previous example described above. Then, as shown in FIG. 6B, an amorphous well layer 12 is crystallized by the same method as in the example described above, and the amorphous well layer 12 is crystallized to form a quantum well 15 having a crystalline well layer 14.

Figure 6C:
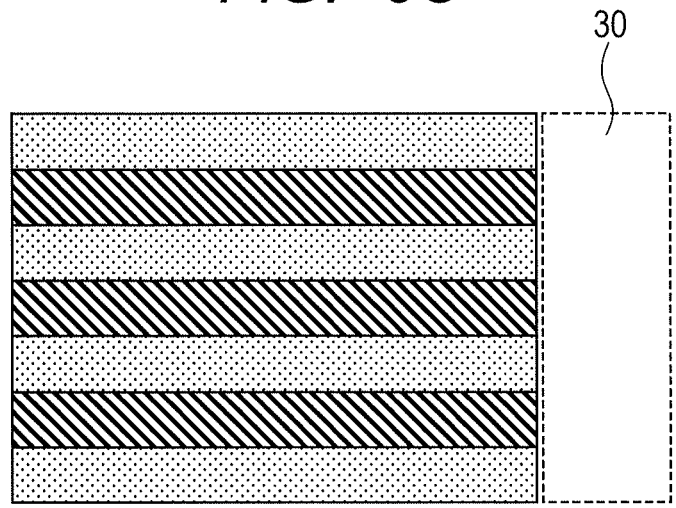
FIG. 6C shows an example of a third cross sectional view showing a method for manufacturing a solar cell according to another example of a first embodiment of the present invention.

Then, as shown in FIG. 6C, a through hole 30 is formed. The through hole 30 is formed by a method, for example, laser, photolithography, or etching. While the depth of the through hole 30 is optional, it is preferred that the through hole 30 penetrates the entire quantum well 15 having the crystalline well layer, for maximizing the advantage of this example that carriers generated as a result of light absorption in the crystalline well layer 14 can reach the p-layer side through electrode 31 or the n-layer side through electrode 32 without passing the barrier layer as described above. For controlling the depth of the through hole 30, a penetration preventive film may be disposed at a desired position. Further, the through hole is preferably formed in a vacuum atmosphere so that no burrs are generated upon forming the through hole.

Figure 6D:
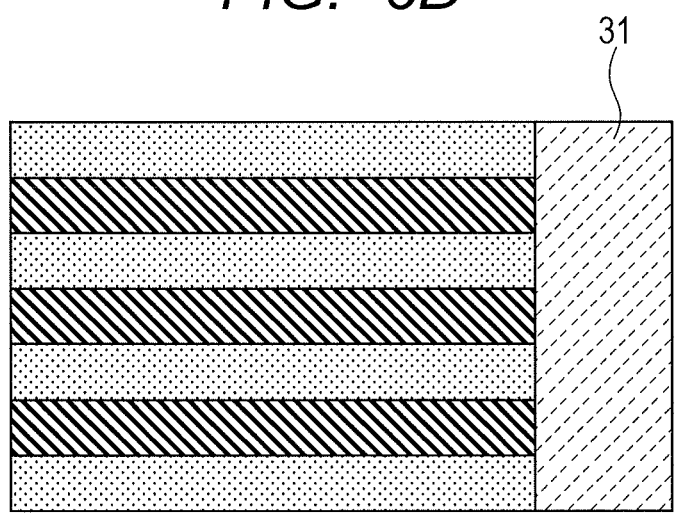
FIG. 6D shows an example of a fourth cross sectional view showing a method for manufacturing a solar cell according to another example of a first embodiment of the present invention.

Then, as shown in FIG. 6D, a p-layer side through electrode 31 is formed by a film deposition method such as a sputtering method, a vapor film deposition method, or a CVD method, or a printing method. The material to be used for the p-layer side through electrode 31 includes a metal or a semiconductor with addition of impurity at high concentration for lowering the electric resistance.

Figure 6E:
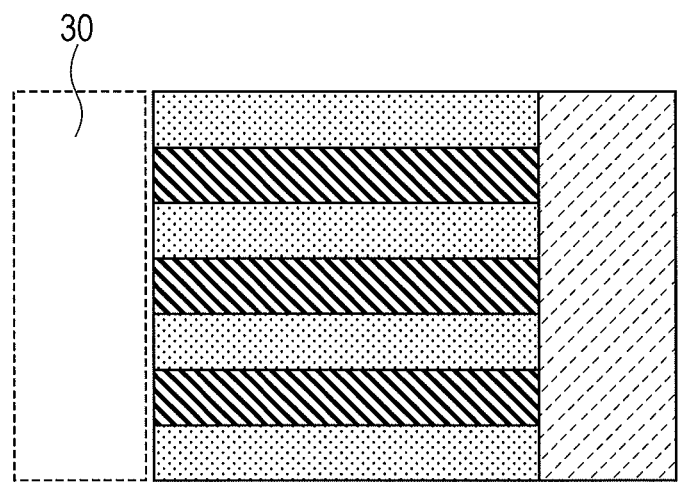
FIG. 6E shows an example of a fifth cross sectional view showing a method for manufacturing solar cell according to another example of a first embodiment of the present invention.
Figure 6F:
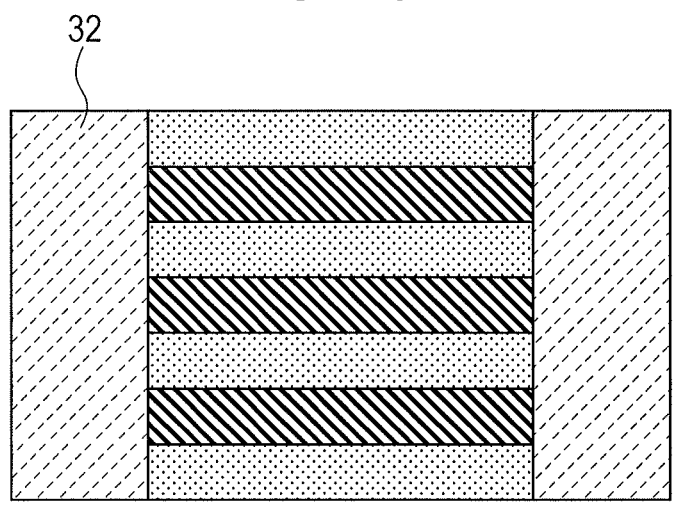
FIG. 6F shows an example of a sixth cross sectional view showing a method for manufacturing solar cell according to another example of a first embodiment of the present invention.

Then, as shown in FIG. 6E, a through hole 30 is formed by the same method as described above in a region of the quantum well 15 having the crystalline well layer where the p-side through hole 31 is not formed. Then, as shown in FIG. 6F, an n-layer side through electrode 32 is formed by the same method as that for the p-layer side through electrode 31. Fermi levels of the constituent materials of the p-layer side through electrode 31 and the n-layer side through electrode 32 are different from each other and electrons spontaneously transfer to the p-layer side through electrode 31 and holes spontaneously transfer to the n-layer through electrode 32, respectively.

According to this example, the following additional effect is further obtained in addition to the effects of the previous example. That is, this example has a feature that the carriers generated in the crystalline well layer 14 transfer inside the crystalline well layer 14 in the lateral direction of FIG. 6 thereby reaching the p-layer side through electrode 31 or the n-layer side through electrode 32. Therefore, it is extremely important to maintain the lamination structure of the quantum well also after annealing for improving the transfer efficiency of the carriers by the reason as described below. That is, when the lamination structure of the quantum well is broken as in the specimen after thermal annealing, carriers have to pass the barrier layer 11 during lateral transfer in the solar cell of the structure of this example, and the output current is remarkably decreased. As described above, since the lamination structure of the quantum well is maintained in this embodiment, an advantageous effect of improving the efficiency of the lateral transfer of carriers inside the crystalline well layer 14 not provided by the previous embodiment can be obtained.

Second Embodiment

FIG. 7 shows the outline of manufacturing steps for a solar cell according to the second embodiment of the invention. Referring to the difference from the first embodiment, while a quantum well is used as a light absorption layer in the first embodiment, the quantum well is used as the constituent material of a tunnel diode in a tandem solar cell.

Figure 7A:
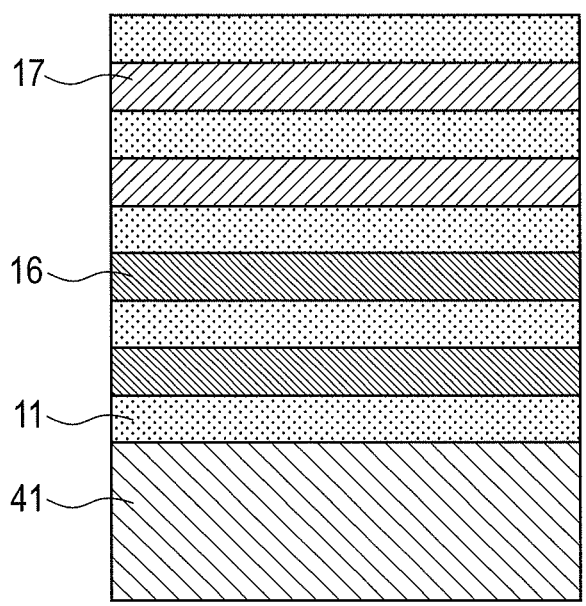
FIG. 7A shows an example of a first cross sectional view showing a method for manufacturing a solar cell according to a second embodiment of the present invention.

In the second embodiment, as shown in FIG. 7A, a first sub-cell 41, a quantum well comprising an amorphous p-well layer 16 and a barrier layer 11, and a quantum well comprising an amorphous n-type well layer 17 and a barrier layer 11 that constitute the tandem solar cell are formed successively. In the first sub-cell, a p-layer of the first sub-cell is present on the side nearer to the quantum well comprising the amorphous p-type well layer 16 and the barrier layer 11. In the second sub-cell 42, an n-layer of a second sub-cell is present at a portion nearer to the quantum well comprising the amorphous n-type well layer 17 and the barrier layer 11.

The first sub-cell is formed by a typical manufacturing method for various solar cells. The quantum well comprising the amorphous p-type well layer 16 and the barrier layer 11, and the quantum well comprising the amorphous n-type well layer 17 and the barrier layer 11 can be formed by the method of forming the quantum well layer 13 having the amorphous well layer in the first embodiment in which formation of the amorphous well layer 12 is replaced with formation of the amorphous p-type well layer 16 or the amorphous n-type well layer 17. Alternatively, they may be formed by adding an impurity to the well layer after forming the quantum well having the well layer with no addition of the impurity by a method of ion implantation, a gas phase diffusion method, or a solid phase diffusion method.

Figure 7B:
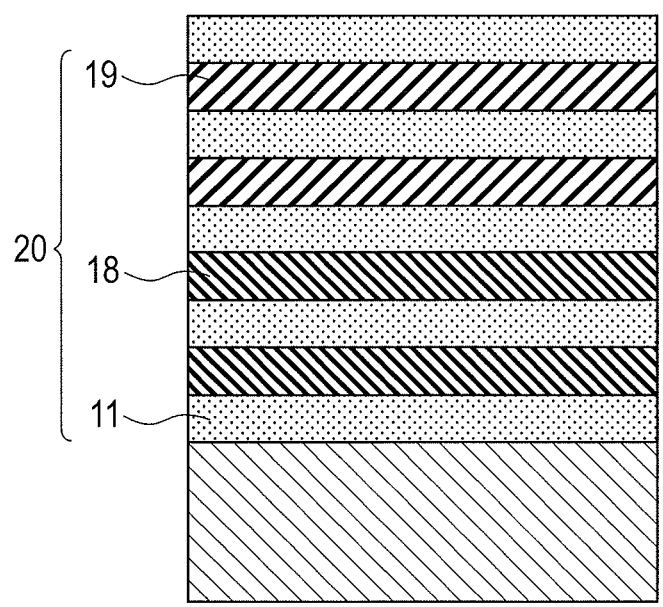
FIG. 7B shows an example of a second cross sectional view showing a method for manufacturing a solar cell according to a second embodiment of the present invention.
Figure 7C:
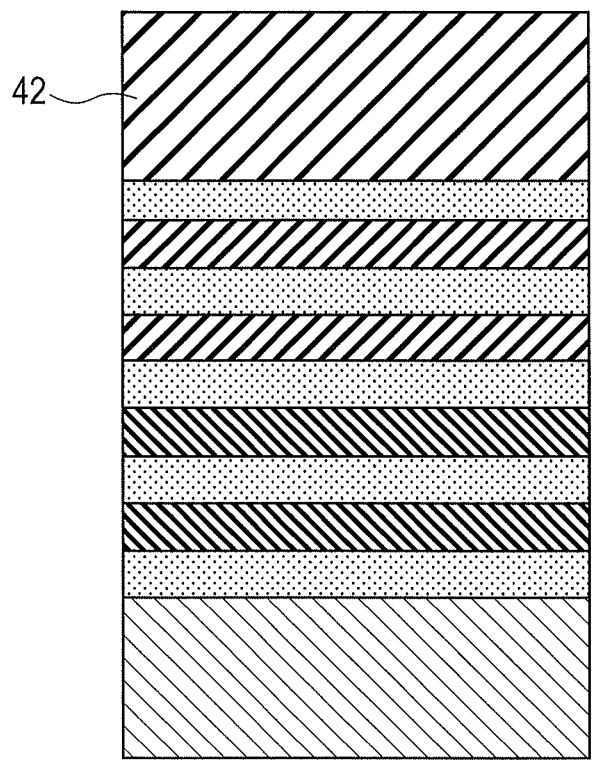
FIG. 7C shows an example of a third cross sectional view showing a method for manufacturing a solar cell according to a second embodiment of the present invention.

Then, as shown in FIG. 7B, annealing is performed to the quantum well comprising the amorphous p-type well layer 16 and the barrier layer 11, and the quantum well comprising the amorphous n-type well layer 17 and the barrier layer 11, thereby crystallizing the amorphous p-type well layer 16 and the amorphous n-type well layer 17 to form a crystalline p-type well layer 18 and a crystalline n-type well layer 19 by the same method as that in the first embodiment. The quantum well comprising the crystalline p-type well layer 18 and the barrier layer 11, and the quantum well comprising the crystalline n-type well layer 19 and the barrier layer 11 constitute a tunnel diode 20. Impurities added to the crystalline p-type well layer 18 and the crystalline n-type well layer 19 may also be activated simultaneously by annealing. Finally, as shown in FIG. 7C, a second sub-cell 42 is formed to provide a tandem solar cell.

Further, this embodiment also has a feature of forming a sub-cell having higher heat conductivity previously and forming another sub-cell after annealing in the formation of the first sub-cell 41 and the second sub-cell 42. Thus, the energy is implanted efficiently to the quantum well upon annealing.

According to the second embodiment, both crystallization of the well layer and thickness control for the well layer can be attained together in a quantum well that constitutes the tunnel diode 20. As a result, by the same reason as that for the first embodiment, it is possible to increase the carrier mobility by crystallization of the amorphous ingredients in the tunnel diode 20, and prevent the generation of energy barrier and increase the mini band forming probability by decreasing the variation of the band gap.

Third Embodiment

FIG. 8 shows the outline of manufacturing steps for a solar cell according to a third embodiment of the invention. Referring to the difference from the first embodiment, while the quantum well is used as the light absorption layer in the first embodiment 1, the quantum well is used as a wavelength conversion layer in this third embodiment.

Figure 8A:
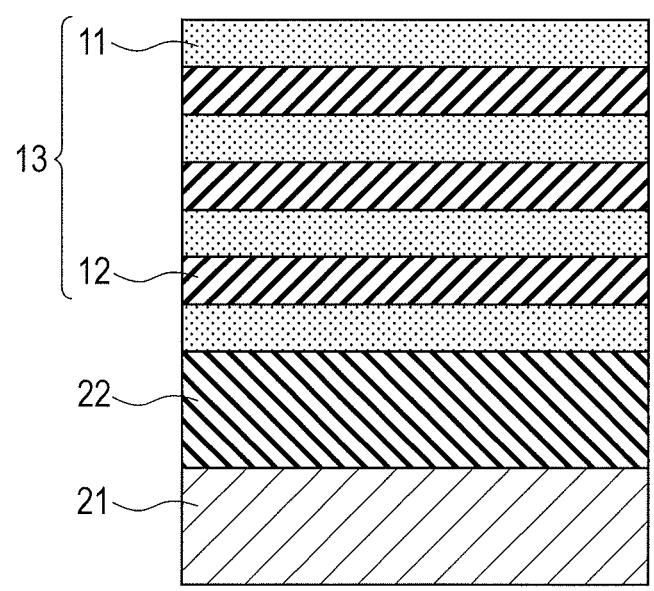
FIG. 8A shows an example of a first cross sectional view showing a method for manufacturing a solar cell according to a third embodiment of the present invention.
Figure 8B:
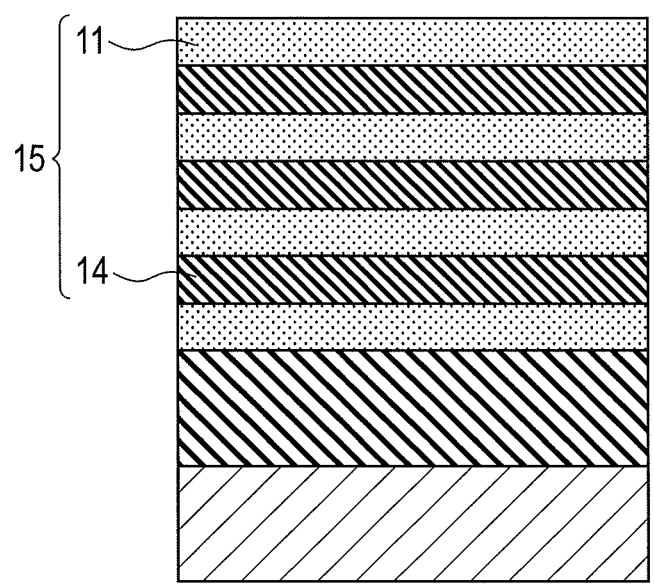
FIG. 8B shows an example of a second cross sectional view showing a method for manufacturing a solar cell according to a third embodiment of the present invention.

In the third embodiment, as shown in FIG. 8A, a solar cell comprising a p-layer 21 and an n-layer 22, and a quantum well 13 having an amorphous well layer are formed successively. The solar cell is formed by a typical manufacturing method for various solar cells. The quantum well 13 having the amorphous well layer is formed by the same method as in the first embodiment. Then, as shown in FIG. 8B, annealing is performed to the quantum well 13 having the amorphous well layer by the same method as that for the first embodiment thereby crystallizing the amorphous well layer 12 to form a quantum well 15 having a crystalline well layer 14.

In the solar cell of the third embodiment, a light may be incident on the side of the quantum well 15 having the crystalline well layer or on the side of the solar cell. When the light is incident on the side of the quantum well 15 having the crystalline well layer, it is preferred that the quantum well 15 having the crystalline well layer is a wavelength conversion layer that converts a short wavelength light into an long wavelength light, that is, a so-called down converter. On the other hand, when a light is incident on the side of the solar cell, the quantum well 15 having the crystalline well layer is preferably a wavelength conversion layer that converts a long wavelength light into short wavelength light, that is, a so-called up converter. Further, the method of the third embodiment is applicable also to a method for manufacturing a solar cell having both the down converter and the up converter.

According to the third embodiment, both crystallization of the well layer and thickness control for the well layer can be attained together in the quantum well forming the wavelength conversion layer. The effect obtained as the result is as described below. At first, since the number of non-radiative defects in the well layer can be decreased, the emission efficiency of the wavelength conversion layer is increased. Further, as a result of decreasing the variation of the band gap in the wavelength conversion layer, both variation of absorption wavelength and that of the emission wavelength of the wavelength conversion layer are decreased. Further, when the wavelength conversion layer is present in the carrier transfer path, the carrier mobility can be increased by crystallizing the amorphous ingredients in the wavelength conversion layer due to the same reason as that of the first embodiment.

Fourth Embodiment

FIG. 9 shows the outline of manufacturing steps for a solar cell according to a fourth embodiment of the invention. Referring to the difference from the first embodiment, while the quantum well is used as a light absorption layer in the first embodiment, the quantum well is used as the energy selection layer of a hot carrier solar cell in the fourth embodiment.

The hot carrier solar cell is a solar cell of attaining a higher output voltage than usual solar cells by collecting hot carriers generated by absorption of a light having higher energy compared with the band gap of the light absorption layer to an electrode before occurrence of energy relaxation. In the hot carrier solar cell, a layer referred to as an energy selection layer having a function of selectively passing only the carriers having a predetermined energy is disposed between the light absorption layer and the electrode in the hot carrier solar cell. Actually, an energy selection layer for allowing carriers having energy at a single level to pass therethrough is not present but carriers passing the energy selection layer have an energy distribution. In the hot carrier solar cell, it has been known that the distribution of carriers passing through the energy selection layer is desirably narrow in the hot carrier solar cell for improving the efficiency of the solar cell. For attaining the energy selection layer, utilization of the resonant tunneling phenomenon shown by a quantum confinement structure such as a quantum well has been attempted vigorously in recent years. The fourth embodiment concerns the application of such a quantum well to the energy selection layer.

Figure 9A:
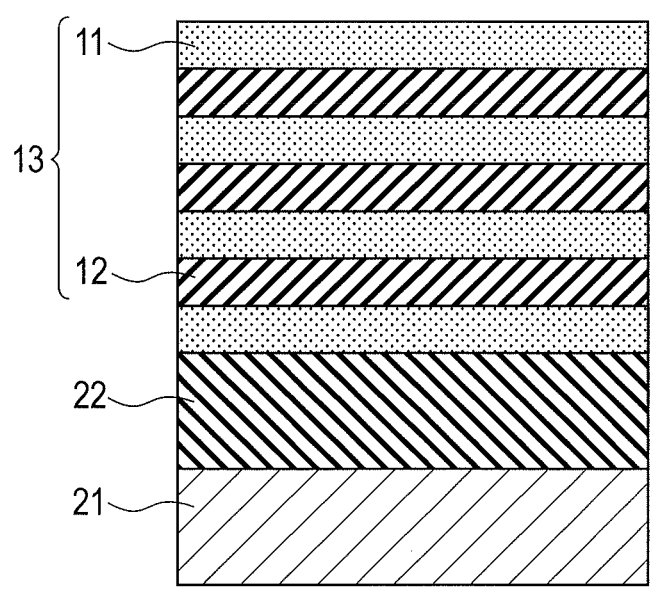
FIG. 9A shows an example of a first cross sectional view showing a method for manufacturing a solar cell according to a fourth embodiment of the present invention.

In the fourth embodiment, as shown in FIG. 9A, a p-layer 21, an n-layer 22, and a quantum well 13 having an amorphous quantum layer are formed successively. While the p-layer 21 and the n-layer 22 are formed by the same method as that of the first embodiment, it is preferred to use a material having a long hot carrier lifetime as the material for the p-layer 21 and the n-layer 22 in the fourth embodiment. The quantum well 13 having the amorphous quantum layer is formed by the same method as that of the first embodiment.

Figure 9B:
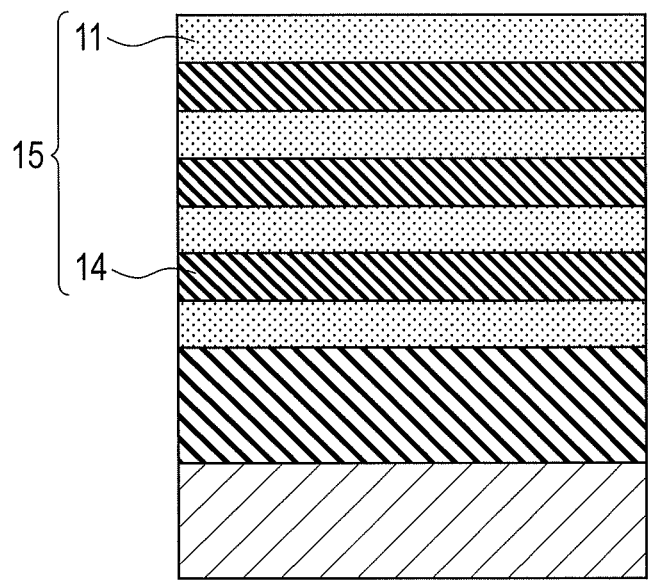
FIG. 9B shows an example of a second cross sectional view showing a method for manufacturing a solar cell according to a fourth embodiment of the present invention.
Figure 9C:
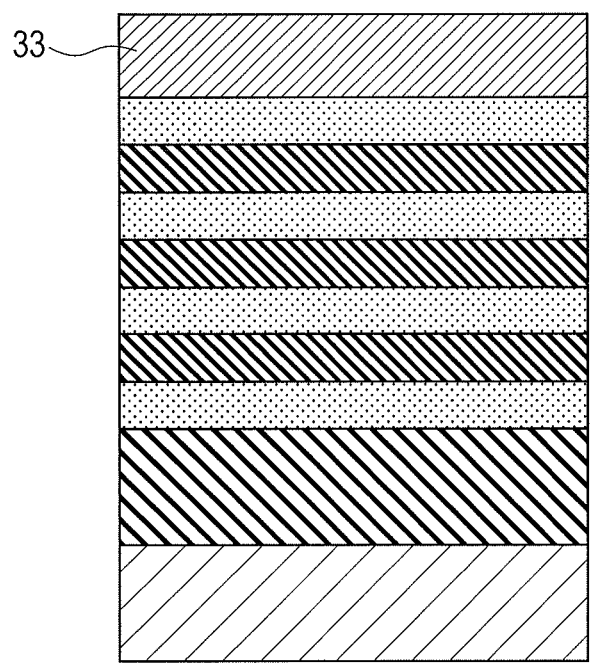
FIG. 9C shows an example of a third cross sectional view showing a method for manufacturing a solar cell according to a fourth embodiment of the present invention.

Then, as shown in FIG. 9B, annealing is performed to the quantum well 13 having an amorphous well layer by the same method as that of the first embodiment thereby crystallizing the amorphous well layer 12 to form a quantum well 15 having a crystalline well layer 14. The quantum well 15 having the crystalline well layer functions as an energy selection layer. Finally, as shown in FIG. 9C, an electrode 33 is formed. In the solar cell, the electrode 33 is generally formed by a printing method but it may be formed also by a film deposition method such as a sputtering method, a vapor film deposition method, or a CVD method. In the fourth embodiment, while the energy selection layer is formed between the n-layer 22 and the electrode 33, it is preferred that the energy selection layer is formed also between the p-layer 21 and the electrode 33 by the same method.

According to the fourth embodiment, both crystallization of the well layer and film thickness control for the well layer can be attained simultaneously in a quantum well that forms the energy selection layer. The effect obtained as a result is as described below. At first, it is possible to increase the carrier mobility by the crystallization of the amorphous ingredients in the energy selection layer and prevent the generation of the energy barrier and increase the mini band forming probability by decrease in the variation of band gaps in the energy selection later by the reason as that for the first embodiment. Further, as a result of decreasing the band gap variation in the energy selection layer, the energy distribution of carriers passing through the energy selection layer can be narrowed. This can improve the efficiency of the hot carrier solar cell.

While the invention made by the present inventors has been described specifically with reference to the preferred embodiments, the present invention is not restricted only to the embodiments described above but may be changed variously within a range not departing from the gist thereof.

What is claimed is:

1. A method for manufacturing a solar cell, comprising:
    forming a first barrier layer,
    forming a second barrier layer,
    forming a first well layer disposed between the first barrier layer and the second barrier layer and containing Si,
    applying an energy density at 1.26 J/mm$^2$ or more and 28.8 J/mm$^2$ or less to the first well layer by irradiating light having an energy that is smaller than a band gap of the first well layer,
    forming a third barrier layer,
    forming a second well layer disposed between the second barrier layer and the third barrier layer,
    forming a first sub-cell connected with the first barrier layer, and
    forming a second sub-cell connected with the third barrier layer,
    wherein the first well layer is a p-type semiconductor and the second well layer is an n-type semiconductor, and
    wherein the energy density is applied to the first well layer after forming the first sub-cell and then the second sub-cell is formed when the heat conductivity of the first sub-cell is higher than the heat conductivity of the second sub-cell.

2. The method for manufacturing a solar cell according to claim 1, further comprising:
    forming a p-layer connected with the first barrier layer, and
    forming an n-layer connected with the second barrier layer.

3. The method for manufacturing a solar cell according to claim 2, wherein the first well layer and the p-layer are connected with each other, and the first well layer and the n-layer are connected with each other.

4. The method for manufacturing a solar cell according to claim 3, further comprising:
    forming a through hole passing through the first barrier layer, the second barrier layer, and the first well layer.

5. The method for manufacturing a solar cell according to claim 1, further comprising:
    forming an n-layer connected with the first barrier layer,
    forming a p-layer connected with the n-layer, and
    forming an electrode connected with the second barrier layer.

6. The method for manufacturing a solar cell according to claim 1, wherein the first barrier layer or the second barrier layer comprises one of $SiO_2$, SiN, and SiC.

7. The method for manufacturing a solar cell according to claim 1, wherein
    the energy density is applied by laser irradiation.

8. The method for manufacturing a solar cell according to claim 7,
    wherein the power density of the laser irradiation is 0.42 kW/mm$^2$ or more.

9. The method for manufacturing a solar cell according to claim 7,
    wherein the time for the laser irradiation is 3 ms or more and 5 ms or less.

* * * * *